US008762903B2

(12) United States Patent
Mohan et al.

(10) Patent No.: US 8,762,903 B2
(45) Date of Patent: Jun. 24, 2014

(54) AUTOMATED CIRCUIT DESIGN FOR GENERATION OF STABILITY CONSTRAINTS FOR GENERICALLY DEFINED ELECTRONIC SYSTEM WITH FEEDBACK

(71) Applicant: Synopsys, Inc., Mountain View, CA (US)

(72) Inventors: Sunderarajan S. Mohan, Mountain View, CA (US); Almir Mutapcic, Burlingame, CA (US); Ricardo Antonio Oliva, Capitola, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/784,626

(22) Filed: Mar. 4, 2013

(65) Prior Publication Data

US 2013/0179849 A1    Jul. 11, 2013

Related U.S. Application Data

(63) Continuation of application No. 12/631,672, filed on Dec. 4, 2009, now Pat. No. 8,392,857.

(60) Provisional application No. 61/120,016, filed on Dec. 4, 2008.

(51) Int. Cl.
*G06F 17/50*          (2006.01)

(52) U.S. Cl.
USPC ......................................................... 716/102

(58) Field of Classification Search
USPC ........................................................... 716/102
See application file for complete search history.

(56) References Cited

U.S. PATENT DOCUMENTS

| 3,569,851 | A  | * | 3/1971  | Jaumann ...................... 330/109 |
| 3,833,927 | A  | * | 9/1974  | Carlson et al. .................... 708/3 |
| 6,269,277 | B1 |   | 7/2001  | Hershenson et al. |
| 6,954,921 | B2 | * | 10/2005 | Hassibi et al. ................. 716/103 |
| 8,392,857 | B2 | * | 3/2013  | Mohan et al. .................. 716/102 |
| 2006/0165206 | A1 | * | 7/2006 | Eikenbroek .................... 375/376 |

OTHER PUBLICATIONS

Daems, Walter, et al, "Simulation-Based Automatic Generation of Signomial and Posynomial Performance Models for Analog Integrated Circuit Sizing," IEEE, Nov. 2001, pp. 70-74.
Deams, Walter, et al, "A Fitting Approach to Generate Symbolic Expressions for Linear and Nonlinear Analog Circuit Performance Characteristics," Proceedings of the 2002 Design, Automation and Test in Europe Conference Exhibition (Date'02), pp. 1-6.
Stojic, M.R., et al, "Generalization of Hurwitz, Nyquist, and Mikhailov Stability Criteria," Abstract, University of Belgrade and Michailo Pupin Institute, Belgrade, Yugoslavia, Manuscript Received Dec. 4, 1964, Revised Mar. 18, 1965, pp. 250-254.

* cited by examiner

*Primary Examiner* — Vuthe Siek
*Assistant Examiner* — Mohammed Alam
(74) *Attorney, Agent, or Firm* — HIPLegal LLP; Judith A. Szepesi

(57) ABSTRACT

A method is described that involves accepting a description of an electronic system having feedback. The method further includes expressing a real root of the electronic system's transfer function and expressing a real part of a complex root of the electronic system's transfer function. The method further includes expressing a time parameter as a maximum of the real root and the real part of a complex root. The method further involves expressing a settling time of the electronic system with the time parameter and using the settling time to automatically generate a design for the electronic system.

20 Claims, 8 Drawing Sheets

$$\frac{V_{out}}{V_{in}} = A_{OL} = \frac{M_O}{(1 + jw\tilde{L}_1)(1 + jw\tilde{L}_2)} \qquad \text{<eqn. 1>}$$

$$\frac{V_{out}}{V_{in}} = A_{CL} = \frac{A_{OL}}{1 + BA_O} = \frac{A_O}{1 + BA_O} \cdot \frac{1}{\left(1 + jw\dfrac{\tilde{L}_1 + \tilde{L}_2}{1 + BA_O} + (jw)^2 \dfrac{\tilde{L}_1 \tilde{L}_2}{1 + BA_O}\right)}$$

$$= \frac{A_O}{1 + BA_O} \cdot \frac{1}{\left[\dfrac{\tilde{L}_1 \tilde{L}_2}{1 + BA_O} s^2 + \dfrac{\tilde{L}_1 + \tilde{L}_2}{1 + BA_O} s + 1\right]} \qquad \text{<eqn. 2>}$$

201 ⟶ for a differential equation of the form $As^2 + Bs + C = \emptyset$, not s $$s = \frac{-B \pm \sqrt{B^2 - 4AC}}{2A} = \frac{-B}{A}\left[\frac{1}{2} \pm \frac{1}{2}\sqrt{1 - \frac{4A}{B^2}}\right] \quad \text{(where C = 1)} \quad \text{<eqn. 3>}$$

$$= \frac{-\tilde{L}_1 + \tilde{L}_2}{\tilde{L}_1 \tilde{L}_2}\left[\frac{1}{2} \pm \frac{1}{2}\sqrt{1 - \frac{4(1 + BA_O)(\tilde{L}_1 \tilde{L}_2)}{(\tilde{L}_1 + \tilde{L}_2)^2}}\right] \qquad \text{<eqn. 3\_i>}$$

FIG. 2 if roots are real, unit step response is (where C in <eqn. 3> = 1):

$$\text{step response (t)} \propto Me^{-\left(\frac{B}{A}\left[\frac{1}{2} - \frac{1}{2}\sqrt{1 - \frac{4A}{B^2}}\right]\right)t} + Ne^{-\left(\frac{B}{A}\left[\frac{1}{2} + \frac{1}{2}\sqrt{1 - \frac{4A}{B^2}}\right]\right)t}$$

(over-damped) <eqn. 4i>

$$\text{step response (t)} \propto (Pt + Q)e^{\frac{-B}{2A}t}$$

(critically damped) <eqn. 4ii> if roots are complex, unit step response is (where C in <eqn. 3> = 1):

$$\text{step response (t)} \propto Re^{\frac{-B}{2}t} \cdot \cos(w^*t - \delta)$$

(under-damped) <eqn. 5>

FIG. 4A $$\tilde{L}\_r = \cfrac{1}{\cfrac{B}{2A}\left[1-\sqrt{1-\cfrac{4A}{B^2}}\right]} = \cfrac{1+\sqrt{1-\cfrac{4A}{B^2}}}{\cfrac{B}{2A}\left[\cfrac{4A}{B^2}\right]}$$

$$\tilde{L}\_r = B\left[\cfrac{1}{2} + \cfrac{1}{2}\sqrt{1-\cfrac{4A}{B^2}}\right]$$

AUTOMATED CIRCUIT DESIGN FOR GENERATION OF STABILITY CONSTRAINTS FOR GENERICALLY DEFINED ELECTRONIC SYSTEM WITH FEEDBACK

RELATED APPLICATIONS

The present application is a continuation of U.S. patent application Ser. No. 12/631,672, filed on Dec. 4, 2009, now U.S. Pat. No. 8,392,857 issuing on Mar. 5, 2013, which claims priority to and the benefit of the filing date of U.S. Provisional Application No. 61/120,016, filed Dec. 4, 2008, entitled "Automated Circuit Design Process For Generation of Stability Constraints for Generically Defined Electronic System with Feedback".

FIELD OF INVENTION

The field of invention relates generally to automated circuit design and more specifically to an automated circuit design process for generation of stability constraints for a generically defined electronic system with feedback.

BACKGROUND

Electronic circuit design, and in particular the process of designing an analog or mixed signal circuit, has often been characterized as a "black art" because of the complex inter-relationships and tradeoffs that exist amongst the circuit's functional characteristics, design parameters and performance objectives. Because circuit designers often cannot fully comprehend all of these inter-relationships and tradeoffs, they have traditionally designed their circuits according to a "trial-and-error" approach. For instance, a designer might start with a nominal design, simulate it and then "tweak" one or two parameters to improve the simulation results. The process repeats until a circuit design is created whose simulation results indicate that the circuit can meet all of its performance requirements.

Recently, "equations based" engineering design tools have been introduced that define a circuit with a set of mathematical equations that effectively capture pertinent inter-relationships and tradeoffs mathematically. The circuit designer specifies known design parameters (such as manufacturing process related parameters) and desired functional characteristics (such as the gain-bandwidth product for an operational amplifier). The designer also specifies a parameter, referred to as "the objective", about which the circuit design is to be optimized (such as minimizing power consumption or minimizing silicon chip surface area consumption). Left as open, undefined design variables are the dimensions (e.g., gate length, gate width and number of gate fingers) of specific transistors within the circuit.

The specifics provided by the designer are combined into the circuit's family of mathematical equations to form a "performance specification". The performance specification is presented to a software tool, referred to as a problem solver, that "solves" the performance specification about the objective. That is, for example, in response to being presented with a performance specification, the problem solver provides as output information specific transistor dimensions that correspond to the circuit's minimum power consumption or minimum surface area consumption for a specific manufacturing process. Thus, using equation based tools, the time and expense of traditional trial-and-error design practices may be greatly reduced.

To date, equations based design techniques have been described for basic analog circuits (such as an op-amp) as well as complex analog or mixed signal systems (such as analog-to-digital-converter). The reader is referred to U.S. Pat. No. 6,269,277 (entitled, "System and Method For Designing Integrated Circuits" and filed on Jul. 27, 1998) as an example of the former and U.S. Pat. No. 6,954,921 (entitled, "Method and Apparatus For Automatic Analog/Mixed Signal System Design Using Geometric Programming" and filed on Apr. 7, 2002) as an example of the later. In the case of more complex systems, typically, the family of equations includes a more abstract or system-level definition of the circuit and the designer provides at least some design parameter specifics at the system-level.

Lower-level equations that describe the circuit at a more specific level of detail are then substituted into specific terms of the system level equations. The process of substituting more specific/detailed equations into terms of higher level equations continues until the family of equations for the system reaches a transistor level of detail (alternatively, the lower equations may simply be added to the performance specification). A performance specification that articulates the circuit at a transistor level of detail is ultimately provided to the problem solver which the solver solves to determine specific dimensions for specific transistors within the circuit and generate a transistor level netlist for the circuit that may be stored on a machine readable storage medium.

An equations based design process that generates, from an abstract definition of a generic feedback system, feedback constraints automatically configured for stable circuit operation and specially configured so that a problem solver will actually calculate a solution has heretofore not been described. The present application pertains to such a process.

BRIEF DESCRIPTION OF THE DRAWINGS

The present invention is illustrated by way of example and not limitation in the figures of the accompanying drawings, in which like references indicate similar elements and in which:

FIG. 2 provides equations that describe the roots of a system with feedback;

FIG. 4a depicts equations for over damped, critically damped and under damped step responses;

FIG. 4b shows the derivation of the maximum time constant of eqn. 4i into a form that is presented as eqn. 6;

DETAILED DESCRIPTION

Figure 1A:
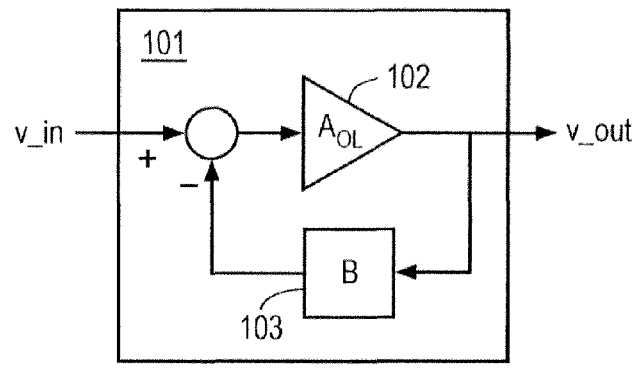
FIG. 1a shows a generic depiction of a circuit with feedback.

A simple feedback system 101, as observed in FIG. 1a, can be characterized as an open loop amplifier 102 and a feedback factor 103. Generally speaking, feedback involves taking the output signal (v_out) of the amplifier 102, processing it according to the feedback factor β and applying the processed output signal at the amplifier's input. Electronic circuits use feedback, for example, to enable the circuit to successfully adapt to changing input conditions (such as keeping amplification constant over a wide range of input signal frequencies).

Figure 1B:
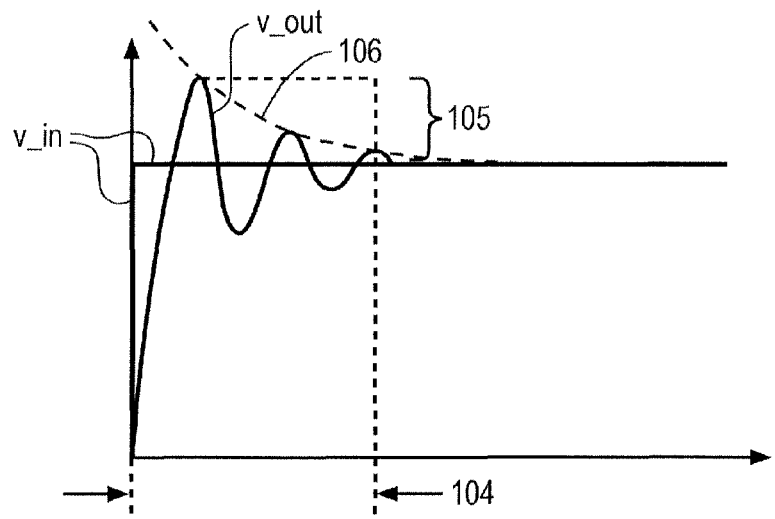
FIG. 1b shows an under damped step response.

Feedback is considered a complex operation that is difficult to correctly design for in view of applicable manufacturing and environmental variations that the circuit may be subjected to. The "settling time" of a feedback circuit, as observed in FIG. 1b, is inter-related with the circuit's stability. FIG. 1b shows, for the feedback system of FIG. 1a, an input signal (v_in) and the resulting output signal (v_out). Note that, in response to the "step" input signal, the presence of feedback introduces "ringing" in the amplifier output signal.

The settling time 104 corresponds to the amount of time it takes for the output ringing to effectively cease. Here, the affect of settling time on stability can be qualitatively described as follows, if the overshoot 105 is too high and/or if the rate of decay 106 of the ringing is too slow, the ringing will take too long to settle. This effectively corresponds to instability—at least when high frequency input signals are applied to the system.

As observed in FIG. 1b, the amount of overshoot 105 in the initial response and the envelope 106 at which the ringing decays affects the circuit's settling time 104. Generally, the amount of feedback $\beta$ and open loop gain $A_O$ helps determine the overshoot 105 while the speed or bandwidth of the open loop amplifier 102 (which is often quantized in terms of the open loop amplifier's "time constants" or "frequency poles") determines the rate at which the ringing decays 106. Thus, through the settling time parameter, the stability of the circuit can be seen to depend on the inter-relationship between the amount of feedback and the gain and bandwidth of the open loop amplifier.

Figure 1C:
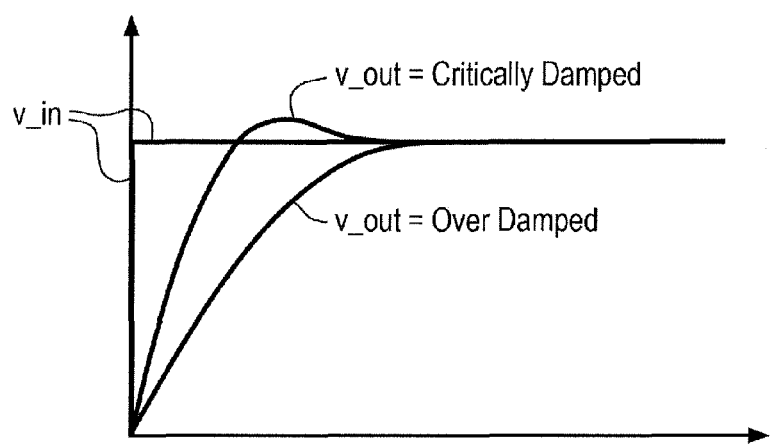
FIG. 1c shows over damped and critically damped responses.

The specific type of output response (v_out) observed in FIG. 1b is referred to as "under-damped". FIG. 1c shows two other types of system output responses to an input step, referred to respectively as "over-damped" and "critically damped". The concept of a settling time parameter can also be applied to the over-damped and critically damped responses as well, in the sense that the settling time represents the amount of time it effectively takes for the output to "settle" within a range about its final value, and, if the settling time is too long, the system may become unstable Likewise, the settling time of the over-damped and critically-damped cases are dependent upon $\beta$, $A_O$ and the time constants of the open loop amplifier.

FIG. 2 provides a mathematical analysis of the output response of the feedback system of FIG. 1a. Eqn. 1 of FIG. 2 provides the gain or transfer function of the open loop amplifier 102, where, the "gain" is the ratio of input signal to output signal. Eqn. 2 of FIG. 2, referred to as the "closed loop response", provides the gain or transfer function of the system when the feedback $\beta$ is considered. Note that a a second order algebraic equation 201 of the form $Xs^2+Ys+Z$ is observed in the denominator of Eqn. 2. Because the highest ordered "s" term in the algebraic equation 201 is a squared term ($s^2$), the feedback system represented by Eqn. 2 may be referred to as a "second order system". The solutions to the algebraic equation, i.e., values of s for which the denominator of the closed loop response equals zero, are referred to as the "zeroes" or "roots" of the closed loop response. Whether the response to the system is under-damped, over-damped or critically-damped depends on the roots of the closed loop response.

Eqn. 3 of FIG. 2 expresses the roots of the closed loop response in general form (Eqn. 3_i expresses the roots of Eqn. 3 consistently with Eqn. 2). Note that Eqn. 3 has a term within a square root, $1-4A/B^2$, referred to herein as the "damping term" 202 and a "$4A/B^2$" term 203 within the damping term 202 that is the inverse of a "damping constant" $\xi^2$ (i.e., $\xi^2 = B^2/4A$). The feedback system of FIG. 1a will be: i) under-damped if the roots are complex conjugates of one another; ii) over-damped if the roots are distinct and real; and, iii) critically damped if the roots are identical and real.

Referring to Eqn. 3, the above paragraph translates into the roots being complex conjugates of one another (under-damped) if the damping term 202 is negative ($1/\xi^2 > 1$); distinct and real (over-damped) if the damping term 202 is positive and real ($1/\xi^2 < 1$) and identical (critically damped) if the damping term 202 is zero ($1/\xi^2 > 1$).

A generic automated design process should therefore be able to consider more than one of these responses. Thus, one embodiment of the equations based design process attempts to articulate equations generically enough so that a design point within any one of these responses may be considered or attempted. Unfortunately, if an equations-based design process does not carefully articulate the constraints of the feedback system, the problem solver may not reach a solution, or, if a solution is reached, the solution may not correspond to a stable circuit. Equations that represent a constraint that keeps the circuit stable should also be included in the family of equations.

Figure 3:
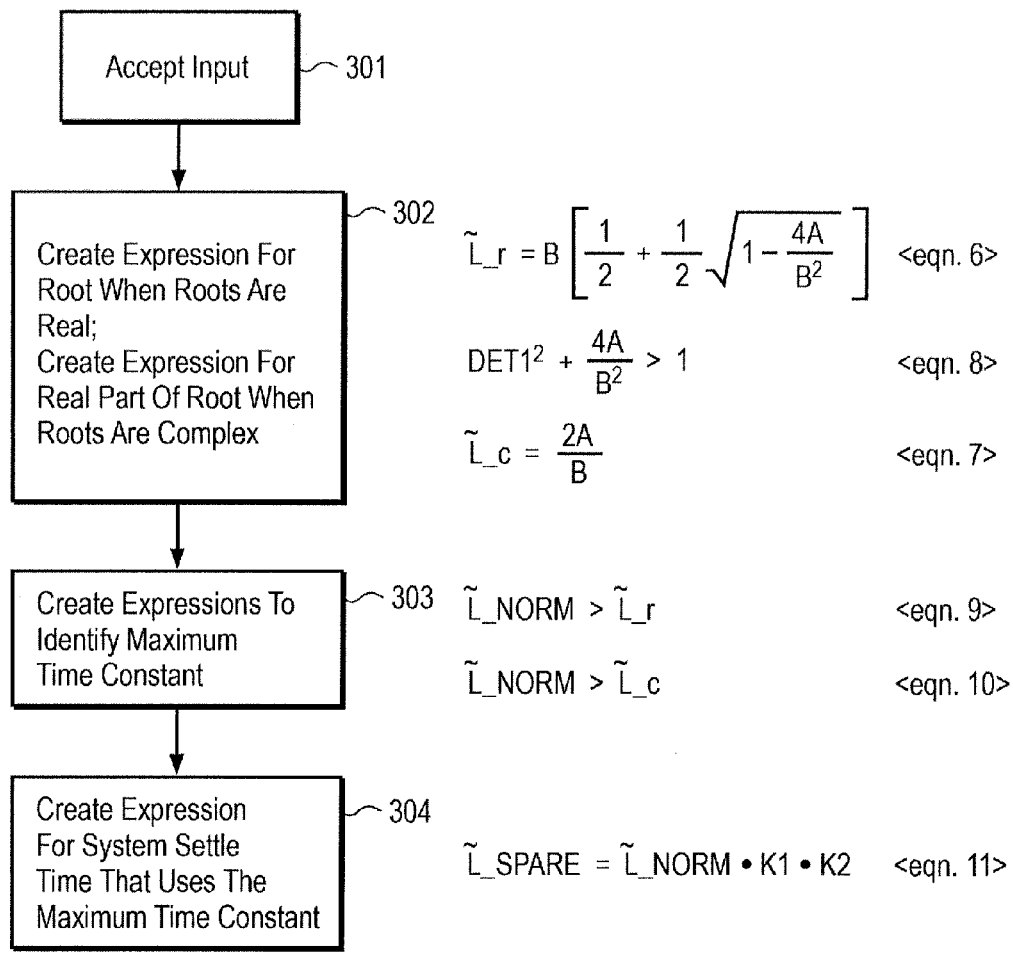
FIG. 3 depicts a process that automatically generates equations that define stability constraints for a system with feedback.

FIG. 3 presents an automated design process that generates equations (also referred to as "constraints") to be entered into a family of equations for an equations based design process of a system with feedback that accounts for these considerations. Notably, the design process of FIG. 3 accepts as input information relatively simplistic definitions of the feedback system so as to "hide" complex inter-relationships associated with feedback from the designer (said another way, the automated design process handles complex feedback details so the designer does not have to). The output of the design process of FIG. 3 is a set of equations for addition to a family of equations for a circuit with feedback. The output equations not only specify constraints of the feedback system that keep the system stable, but also, are articulated in a special way so that a problem solver will be able to successfully calculate a solution. Aspects of these features are described in more detail immediately below.

Referring to FIG. 3, the automated process first accepts input information 301 that describes aspects of the system at a high level of detail. According to one approach for a $2^{nd}$ order amplifier system such as the $2^{nd}$ order amplifier system observed in FIG. 1, the input information is merely an equation for the transfer function of the open loop amplifier (e.g., Eqn. 1) and a specification of the feedback factor $\beta$, or, the transfer function of the closed loop amplifier (e.g., Eqn. 2). According to a further embodiment, the designer may also specify a damping constant $\xi^2$ which effectively sets a constraint on the ratios of the coefficients A, B, C within the quadratic equation in the denominator of the closed loop response (see, Eqns. 2 and 3 of FIG. 2). Regardless, once the input information is presented 301, the automated design process extracts and/or identifies quadratic coefficients A, B and C (noting that some processes may define one of these coefficients equal to 1 such as A=1 as presented in the figures of this specification) and/or restates them in terms of the damping constant $\xi^2$.

The automated process then proceeds to construct equations/constraints that are subsequently added to a family of equations for a circuit under design. FIG. 3 shows six equations (Eqns. 6 through 11) that, in an embodiment, correspond to the constructed equations. According to FIG. 3, the automated process expresses 302 both: i) the root(s) of the quadratic equation when the root(s) are real (i.e., the under-damped and critically damped cases); and, ii) the real part of the roots of the quadratic equation when the roots are complex (i.e., the over-damped case). However, before explaining an embodiment of how these relationships are expressed, some discussion of the underlying mathematics is appropriate. FIGS. 4$a,b$ addresses these underlying mathematical principles in detail.

Eqns. 4i and 4ii of FIG. 4$a$ show the step response when the roots are real. Eqn. 4i corresponds to the over-damped case where the damping term 202 of Eqn. 3 is positive ($1/\xi^2<1$) and Eqn. 4ii corresponds to the critically damped case where the damping term 202 of Eqn. 3 is zero ($1/\xi^2=1$). Here, M, N, P and Q correspond to constants. Eqn. 5 shows the step response when the roots are complex (again, R is a constant). When the roots are complex, referring to Eqn. 3 of FIG. 2, the damping term 202 is negative ($1/\xi^2>1$). In this case the roots can be expressed as $-B/2+/-j(1-(4A/B^2))^{0.5}$ which has a real part=$-B/2$ (again, where C=1).

Comparing each of Eqns. 4i, 4ii and 5, note that each equation has a term of the form $e^{-t/\tau}$ where $\tau$ is the inverse of a real root (if the roots are real as in Eqns. 4i and 4$ii$) or the inverse of a real part of the root (if the roots are complex as in Eqn. 5). The inverse of a real root, or the inverse of a real part of a complex root, can therefore be viewed as a parameter that controls the rate at which the step response (v_out in FIG. 1$b$ or 1$c$) approaches its final value. As described in more detail below, a maximum of these values (i.e., the slowest rate of decay in the exponential terms of Eqns. 4_i, 4_ii and 5) is used to generate a constraint on the settling time of the system (FIG. 4$b$ demonstrates how the time constant for the slowest rate of decay in eqn. 4i can be represented as observed in eqn. 6).

Referring then to the automated design process of FIG. 3, at sequence 302, an expression for the roots is articulated for the case where the roots are real (over-damped and critically damped) and, an expression for the real part of the roots is articulated for the case where the roots are complex (under-damped). These expressions are respectively observed in FIG. 3 as time constants $\tau\_r$ (Eqn. 6) and $\tau\_c$ (Eqn. 7).

As such, according to one embodiment of the process of FIG. 3, the automated design process constructs Eqns. 6 and 7. Then, another set of equations is constructed 303 (Eqns. 9 and 10), that sets a time constant parameter, $\tau\_norm$, to an amount of time that is greater than the largest of these time constants (e.g., $\tau\_norm>\min(\tau\_r, \tau\_c)$). This has the effect of identifying the slowest rate of decay amongst the possible step responses. Here, consistent with this view, note that $\tau\_r$ (Eqn. 6) captures the slowest rate of decay amongst the two exponentially decaying terms in Eqn 4i.

Once the slowest rate of decay is identified amongst the possible responses 303, it is used to formulate 304 a constraint (Eqn. 11) for the settling time ($\tau\_settle$) of the circuit's output signal. By basing the settling time on the slowest rate of decay amongst the possible step responses, stability is built into the circuit in the sense that the circuit is being designed to settle within the worst case (slowest) decay envelope.

The constraint on settling time established at process 304 is subsequently added to other equation (s) in the family of equations that specify the settling time in terms of other design parameters—such as specific transistor dimensions. Those of ordinary skill can easily articulate such additional equations. For instance, one of ordinary skill can easily recognize that an amplifier's time constant can be represented as C/gm where gm is transistor transconductance and C is load capacitance. In this manner, the circuit's design process includes stability considerations.

Other practical considerations are noteworthy. Firstly, note that Eqn 6 for tau_r contains the square root of the damping term 202. In an embodiment, practical considerations go into defining this square root term as a separate variable DET1, subject to the constraint expressed by Eqn. 8. and, in addition, restricted to be positive and real number (as opposed to complex or imaginary). From Eqn. 3 of FIG. 2, in mathematical terms, DET1 is defined by the equation DET1=$(1-4A/B^2)^{1/2}$. However, due to practical considerations, this definition, which amounts to an equality constraint, is instead considered in the form of an inequality constraint DET1$^2$+$(4A/B^2)\geq1$, as expressed by Eqn. 8 of FIG. 3.

The restriction of DET1 to be a positive real number as the effect of preventing tau_R from becoming complex even when the solver is considering a solution in the under-damped domain (which, as discussed previously, is characterized by the presence of complex roots). This is not a restriction in the type of solution produced by the solver, since the solver may produce a value for tau_r and for tau_c concurrently. The recognition of tau_r as a time constant when the roots are real and of tau_c as the time constant when the roots are complex is an element of the processing of the solution produced by the solver.

Articulation of DET1 terms as described above [0038] permits even those problem solvers that can only operate on the real domain (solvers that can only solve problems expressed in terms of real numbers,) to produce a solution for the under-damped case without having to consider complex or imaginary numbers. This is of current practical value as many more problem solvers operate in the real domain than in the complex domain.

The inequality expressed by Eqn. 8 alone allows for DET1 to be any value however large, when in practice in circuit DET1 only takes values between 0 and 1 inclusive when roots are real. Therefore in addition to restricting DET1 to be positive, a limit is placed on the max value (an upper bound) of DET1 through an additional inequality constraint (not observed in FIG. 3). For example, according to one embodiment, DET1 is limited to be less than 1.0. In this case, the critically damped case is still represented through Eqn. 7 (essentially the critically damped case can be viewed as a singularity where the under damped and over damped cases "meet" at $4A/B^{2=1}$).

With respect to the articulation of the settling time constraint in process 304, FIG. 3 indicates that some additional factors (e.g., k1, k2) may be applied so as to link the settling time to the time constant with for systems of order 2 and above. The factors follow common practices used by circuit designers. For example, for precisions in the range 0.01 to 0.00001, the settling time may be written as $$\text{settling time}=-\ln(\text{precision})(\tau\_norm)k1 \quad \text{Eqn. 12a}$$

$$\text{where, } k1=(B/\tau\_norm)^{(0.25-0.032\ \ln(\text{precision}))} \quad \text{Eqn. 12b}$$

Note that for precisions close to 0.004, expression 12b reduces to a commonly used approximation k1=$(B/\tau\_norm)^{0.50}$.

Other factors may compensate a previous scaling of s or the frequency/time scale. For instance, according to one approach k2 includes an "s" scaling factor. The s scaling factor is a scaling factor used to limit the numerical space that the problem solver solves over. That is, conceivably, each of A, B and C in Eqn. 3 can be within a wide range of numerical values.

In order to reasonably bound the numerical ranges over which the problem solver will calculate solutions, a quadratic equation of the form $Ks^2+Ms+N=0$ is "pre-processed" as follows before the equations generated by sequences 302, 303 304 are attempted. First, the equation is normalized by N to produce $(K/N)s^2+(M/N)s+1=0$. Then, s is scaled by (M/N) to produce a quadratic equation of the form $(KN/M^2)\overline{s}^2+\overline{s}+1=0$ where $\overline{s}=(M/N)s$. A quadratic equation of this form $\overline{s}$ is then utilized to generate the feedback equations as discussed above. As such, in an embodiment, k2 includes (N/M) to rescale the amount of time represented by τ_settle to a value that is in accordance with $\overline{s}$ rather than s.

A similar approach can be taken with respect to frequency. For instance, according to one embodiment all frequencies are normalized by the unity gain bandwidth of the feedback system (which has the effect of increasing the values of time constants such as τ_norm and τ_settle). As such, when the settling time is calculated 304, rescaling back to the proper time value is accomplished by normalizing by the unit gain bandwidth. k2 may therefore also include a factor that is the inverse of the unity gain bandwidth.

The present discussion has so far concerned only second order algebraic equations. That is, equations of the form $As^e+Bs+C=0$. Feedback systems can be higher order such as $3^{rd}$ order, $4^{th}$ order, $5^{th}$ order, $6^{th}$ order, etc., where the order specifies the highest powered s term (e.g., $s^3$ for a $3^{rd}$ order system, $s^4$ for a $4^{th}$ order system, $s^5$ for a $5^{th}$ order system, $s^6$ for a sixth order system, etc.). For simplicity, algebraic equations of order 4, 6, 8, etc. are hereinafter referred to as even ordered algebraic equations and algebraic equations of order 3, 5, 7, etc. are hereinafter referred to as odd ordered algebraic equations.

Figure 5A:
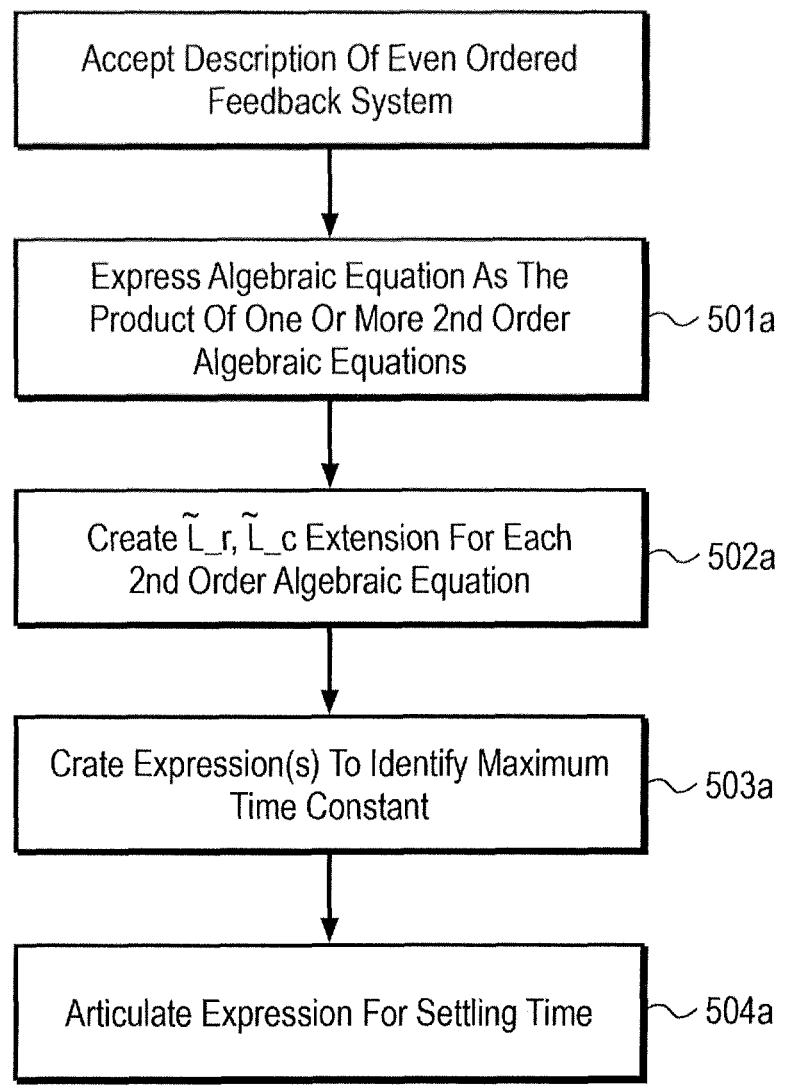
FIG. 5a depicts a process for generating stability constraints for an Nth order feedback system where N is even.

FIG. 5a shows a process for developing a family of equations for a system with feedback whose closed loop transfer function contains an even ordered algebraic equation. The process of FIG. 5a utilizes a mathematical property whereby any even ordered algebraic equation can be articulated as the product of multiple second order algebraic equations. Specifically, a $4^{th}$ order algebraic equation can be expressed as the product of two second order algebraic equations, a $6^{th}$ order algebraic equation can be expressed as the product of three second order algebraic equations, an $8^{th}$ order algebraic equation can be expressed as the product of four second order algebraic equations, etc.

As such, the process of FIG. 5a initially expresses an even ordered algebraic equation as the product of the correct number of second order algebraic equations 501a. Once the even ordered algebraic equation is broken down into the correct number of second order algebraic equations, a τ_r, τ_c pair is articulated 502a for each second order algebraic equation (e.g., process 302 of FIG. 3 is performed for each second order algebraic equation). For example, a $6^{th}$ order algebraic equation will be broken down into three second order equations and three pairs of τ_r and τ_c time constants will be articulated—one τ_r, τ_c pair for each second order algebraic equation. The maximum time constant amongst all of these time constants is then selected 503a and the selected maximum time constant is used in an expression for settling time 504a (e.g., as described with respect to processes 303 and 304 of FIG. 3). In the case of a $6^{th}$ order algebraic equation, the maximum time constant amongst the six time constants generated from process 502a is selected 503a and incorporated into an expression for settling time 504a.

Figure 5B:
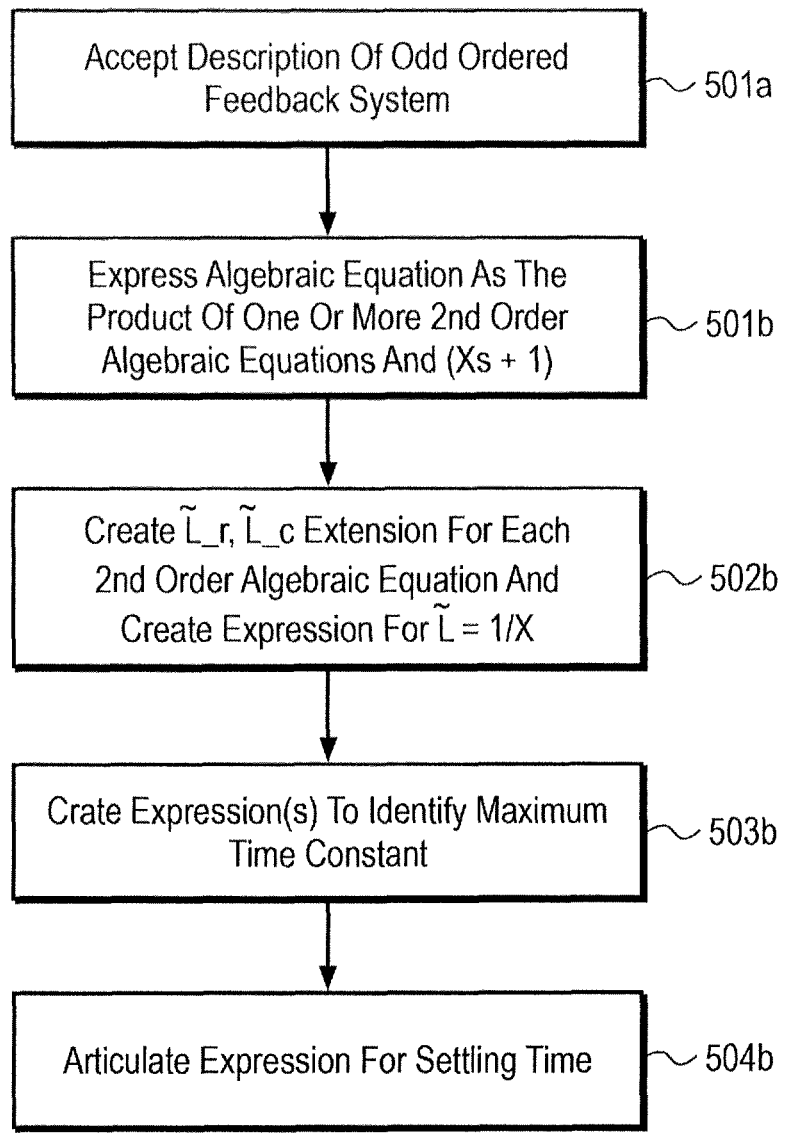
FIG. 5b depicts a process for generating stability constraints for an Nth order feedback system where N is odd.

The process of FIG. 5b for odd ordered algebraic equations is similar to that of FIG. 5a except that a different mathematical property applies. Specifically, an odd ordered algebraic equation can be broken down as a product of one or more second order algebraic equations and an equation of the form $Xs+1=0$ (which has a solution of the form $e^{-Xt}$). For instance, a $3^{rd}$ order algebraic equation can be expressed as the product of a second order algebraic equation and an equation of the form $Xs+1=0$; a $5^{th}$ order algebraic equation can be expressed as the product of two second order algebraic equations and an equation of the form $Xs+1=0$, etc.

Therefore, as observed in FIG. 5b, an odd ordered algebraic equation is initially expressed as the product 501b of the correct number of second order algebraic equations and an equation of the form $Xs+1=0$. The τ_r, τ_c time constant pairs for each second order algebraic equation and the time constant for the $Xs+1=0$ equation (which is τ=1/X) are then expressed 502b. The maximum time constant amongst the expressed time constants is selected 503b and used in an expression for the settling time of the system 504b.

It is pertinent to point that although the discussion of FIGS. 5a and 5b was written in terms of the execution of calculations these processes can also be applied to generate equations for inclusion into a family of equations for a system having feedback which is subsequently solved by a problem solver. For instance process 502a,b corresponds to the generation of equations for time constants, process 503 corresponds to the generation of an equation that selects the maximum of these time constants, and process 504 corresponds to the generation of an equation for settling time that uses the time constant that is effectively selected by the equation (s) generated in process 504.

Once the generated equations are added to the family of equations, the family of equations may undergo a series of substitutions such that the family of equations express the system at the transistor level of detail. When the system is expressed at the transistor level of detail the problem solver solves the equations about the objective for specific transistor dimensions.

It is also pertinent to point out that the processes described herein can be applied to other types of systems (e.g., mechanical systems—such as the time it takes for a vibration to die down or a moving object to stop or stabilize). Also, time can be expressed as the inverse of frequency. Thus, expression of a frequency parameter can be viewed as an expression of a time parameter (in the sense that a large frequency parameter corresponds to a small time parameter).

Processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.)), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

Figure 6:
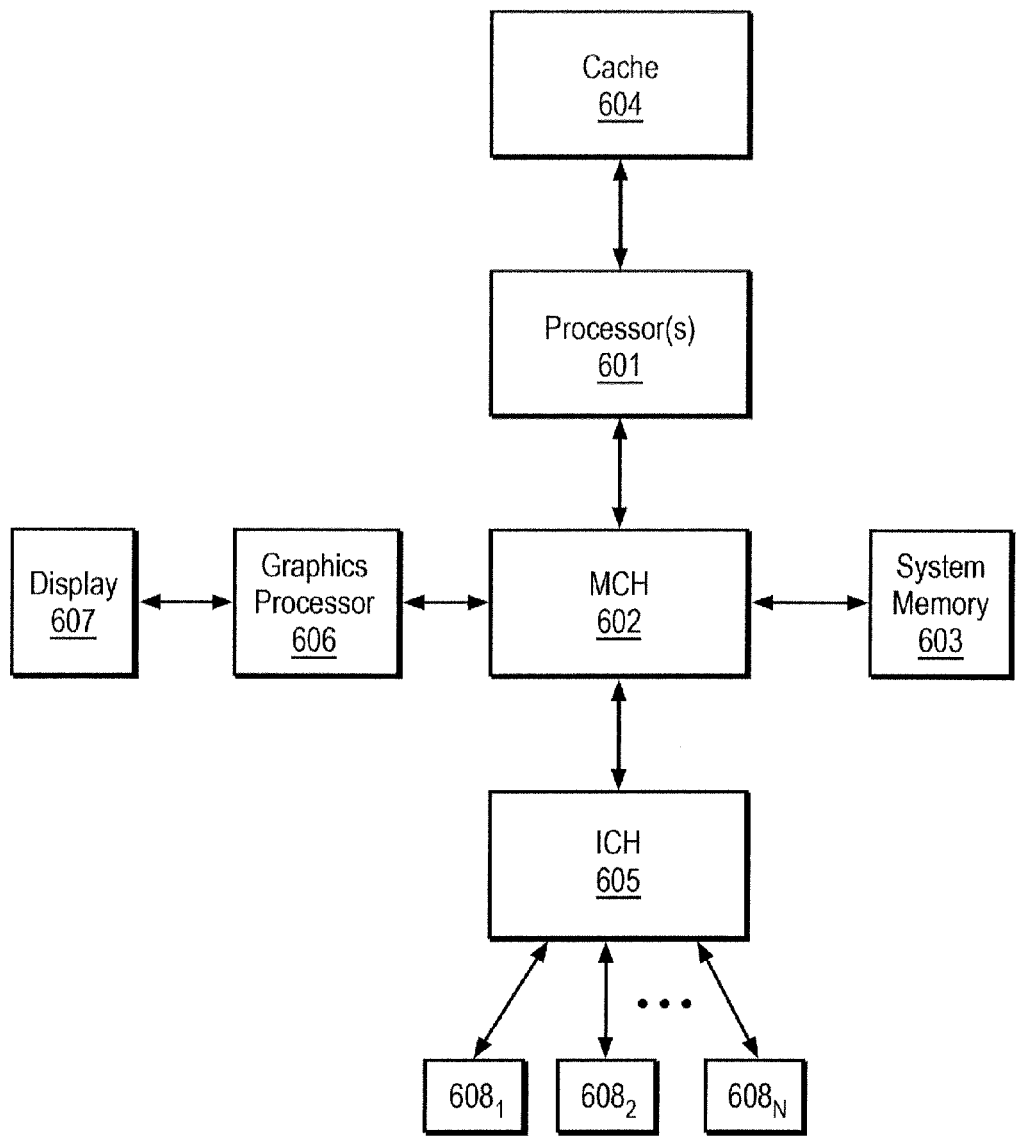
FIG. 6 depicts a computing system.

FIG. 6 shows an embodiment of a computing system (e.g., a computer). The exemplary computing system of FIG. 6 includes: 1) one or more processors 601 (in the case of single threaded processors there should be more than one processor, in the case of multi-threaded processors one or more processors should be sufficient); 2) a memory control hub (MCH) 602; 3) a system memory 603 (of which different types exist such as DDR RAM, EDO RAM, etc,); 4) a cache 604; 5) an I/O control hub (ICH) 605; 6) a graphics processor 606; 7) a display/screen 607; and, 8) one or more I/O devices 608.

The one or more processors 601 execute instructions in order to perform the software routines the computing system implements. The instructions frequently involve some sort of operation performed upon data. Both data and instructions are stored in system memory 603 and cache 604. Cache 604 is typically designed to have shorter latency times than system memory 603. For example, cache 604 might be integrated onto the same silicon chip(s) as the processor(s) and/or constructed with faster SRAM cells whilst system memory 603 might be constructed with slower DRAM cells. By tending to store more frequently used instructions and data in the cache 604 as opposed to the system memory 603, the overall performance efficiency of the computing system improves.

System memory 603 is deliberately made available to other components within the computing system. For example, the data received from various interfaces to the computing system (e.g., keyboard and mouse, printer port, LAN port, modem port, etc.) or retrieved from an internal storage element of the computing system (e.g., hard disk drive) are often temporarily queued into system memory 603 prior to their being operated upon by the one or more processor(s) 601 in the implementation of a software program. Similarly, data that a software program determines should be sent from the computing system to an outside entity through one of the computing system interfaces, or stored into an internal storage element, is often temporarily queued in system memory 603 prior to its being transmitted or stored.

The ICH 605 is responsible for ensuring that such data is properly passed between the system memory 603 and its appropriate corresponding computing system interface (and internal storage device if the computing system is so designed). The MCH 602 is responsible for managing the various contending requests for system memory 603 access amongst the processor(s) 601, interfaces and internal storage elements that may proximately arise in time with respect to one another.

One or more I/O devices 608 are also implemented in a typical computing system. I/O devices generally are responsible for transferring data to and/or from the computing system (e.g., a networking adapter); or, for large scale non-volatile storage within the computing system (e.g., hard disk drive). ICH 605 has bi-directional point-to-point links between itself and the observed I/O devices 608.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed:

1. A non-transitory machine readable storage medium having program code which when executed by a machine causes said machine to perform a method, said method comprising:
expressing roots of a closed loop electronic system's transfer function when the roots are real, and expressing a real part of the roots of the closed loop electronic system's transfer function when the roots are complex conjugates of one another, wherein the roots are solutions to which a denominator of the transfer function equals zero;
expressing a time parameter as greater than a maximum of the expressed roots and the expressed real part of the roots; and
using a settling time for the closed loop electronic system, expressed using the time parameter, to automatically generate a design for the closed loop electronic system.

2. The machine readable storage medium of claim 1, wherein said method further comprises;
solving a family of equations that describe the closed loop electronic system and that incorporates the settling time to define specific dimensions of transistors within the closed loop electronic system.

3. The machine readable storage medium of claim 1, wherein the roots are distinct and real when a damping term of the transfer function is
real and positive.

4. The machine readable storage medium of claim 1, wherein the time parameter is a maximum damped response decay time parameter.

5. The machine readable storage medium of claim 1, wherein the transfer function includes a second order algebraic equation.

6. The machine readable storage medium of claim 1, wherein the transfer function includes an even ordered algebraic equation that has an order higher than two.

7. The machine readable storage medium of claim 6, wherein the method further comprises:
expressing the even ordered algebraic equation as a product of a plurality of second order algebraic equations;
expressing real roots and a real part of complex roots for each of the plurality of second order algebraic equations; and
expressing the time parameter as a maximum of the real roots and the real parts of the complex roots.

8. The machine readable storage medium of claim 1, wherein the transfer function includes an odd ordered algebraic equation that has an order higher than two.

9. The machine readable storage medium of claim 8, wherein the method further comprises:
expressing the odd ordered algebraic equation as a product of a set of second order algebraic equations and an equation of the form $Xs+1=0$;
expressing real roots and a real part of complex roots for each of the set of second order algebraic equations; and
expressing the time parameter as a maximum of the real roots, the real parts of the complex roots, and a time constant for the equation of the form $Xs+1=0$.

10. A computing system having program code stored on a non-transitory machine readable storage medium, wherein when the program code is processed with a processing unit of the computing system a method is performed, the method comprising:
calculating roots of a closed loop electronic system's transfer function when the roots are real, and calculating a real part of the roots of the closed loop electronic system's transfer function when the roots are complex conjugates of one another, wherein the roots are solutions to which a denominator of the transfer function equals zero;

calculating a time parameter as greater than a maximum of the calculated roots and the calculated real part of the roots; and using a settling time for the closed loop electronic system, calculated using the time parameter, to automatically generate a design for the closed loop electronic system.

11. The computing system of claim 10, wherein the method further comprises;

solving a family of equations that describe the closed loop electronic system and that incorporates the settling time to define specific dimensions of transistors within the closed loop electronic system.

12. The computing system of claim 10, wherein the roots are distinct and real when a damping term of the transfer function is
real and positive.

13. The computing system of claim 10, wherein the time parameter is a maximum damped response decay time parameter.

14. A method comprising processing program code on a computer to perform operations comprising:

calculating, by a computing device, roots of a closed loop electronic system's transfer function when the roots are real, and calculating a real part of the roots of the closed loop electronic system's transfer function when the roots are complex conjugates of one another, wherein the roots are solutions to which a denominator of the transfer function equals zero;

calculating a time parameter as greater than a maximum of the calculated roots and the calculated real part of the roots; and using a settling time for the closed loop electronic system, calculated using the time parameter, to automatically generate a design for the closed loop electronic system.

15. The method of claim 14, wherein the operations further comprise;

solving a family of equations that describe the closed loop electronic system and that incorporates the settling time to define specific dimensions of transistors within the closed loop electronic system.

16. The method of claim 14, wherein the transfer function includes a second order algebraic equation.

17. The method of claim 14, wherein the transfer function includes an even ordered algebraic equation that has an order higher than two.

18. The method of claim 17, wherein the operations further comprise:

calculating the even ordered algebraic equation as a product of a plurality of second order algebraic equations;

calculating real roots and a real part of complex roots for each of the plurality of second order algebraic equations; and calculating the time parameter as a maximum of the real roots and the real parts of the complex roots.

19. The method of claim 14, wherein the transfer function includes an odd ordered algebraic equation that has an order higher than two.

20. The method of claim 19, wherein the operations further comprise:

calculating the odd ordered algebraic equation as a product of a set of second order algebraic equations and an equation of the form $Xs+1=0$;

calculating real roots and a real part of complex roots for each of the set of second order algebraic equations; and calculating the time parameter as a maximum of the real roots, the real parts of the complex roots, and a time constant for the equation of the form $Xs+1=0$.

* * * * *